(12) United States Patent
Likhanskii et al.

(10) Patent No.: US 11,651,932 B1
(45) Date of Patent: May 16, 2023

(54) MISMATCHED OPTICS FOR ANGULAR CONTROL OF EXTRACTED ION BEAM

(71) Applicant: Applied Materials, Inc., Santa Clara, CA (US)

(72) Inventors: Alexandre Likhanskii, Middleton, MA (US); Jay T. Scheuer, Rowley, MA (US); Sudhakar Mahalingam, Lexington, MA (US); Nevin Clay, Charlestown, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/510,996

(22) Filed: Oct. 26, 2021

(51) Int. Cl.
  *H01J 37/08* (2006.01)
  *H01J 37/05* (2006.01)
  *H01J 37/317* (2006.01)

(52) U.S. Cl.
  CPC .............. *H01J 37/08* (2013.01); *H01J 37/05* (2013.01); *H01J 37/3171* (2013.01)

(58) Field of Classification Search
  CPC ......... H01J 37/08; H01J 37/05; H01J 37/3171
  USPC ........................................... 250/492.1–492.3
  See application file for complete search history.

(56) References Cited

U.S. PATENT DOCUMENTS

| 2005/0098117 A1 | 5/2005 | DiVergilio et al. |
| 2007/0107841 A1 | 5/2007 | Horsky et al. |
| 2009/0236547 A1* | 9/2009 | Huang ................ H01J 37/3171 250/492.21 |
| 2010/0200768 A1 | 8/2010 | Buff et al. |
| 2014/0326901 A1* | 11/2014 | Colvin ................ H01J 37/3171 118/723 R |
| 2016/0111250 A1 | 4/2016 | Sato |
| 2020/0194219 A1* | 6/2020 | Heres .................. H01J 37/3171 |

FOREIGN PATENT DOCUMENTS

WO  2008/147846 A1  12/2008

OTHER PUBLICATIONS

International Search Report and Written Opinion dated Jan. 18, 2023 in corresponding PCT application No. PCT/US2022/044861.

* cited by examiner

*Primary Examiner* — Michael Maskell
(74) *Attorney, Agent, or Firm* — Nields, Lemack & Frame, LLC

(57) ABSTRACT

An ion source capable of extracting a ribbon ion beam with improved vertical angular uniformity is disclosed. The extraction plate and extraction optics are designed such that there is at least one non-uniform gap between adjacent components. A non-uniform gap may be effective in reducing angular spread non-uniformity of the extracted ribbon ion beam. Specifically, for a given gap in the Z direction, ions extracted from regions with lower plasma density may have more vertical angular spread. A larger gap in the Z direction between components in this region may make the vertical angular spread closer to the vertical angular spread of ions extracted from regions with higher plasma density. The non-uniform gap may be created by having an extraction plate that is flat or curved and electrodes that are flat, convex or concave. In certain embodiments, the non-uniform gap is located between the extraction plate and the suppression electrode.

20 Claims, 8 Drawing Sheets

US 11,651,932 B1

MISMATCHED OPTICS FOR ANGULAR CONTROL OF EXTRACTED ION BEAM

This disclosure describes systems for controlling the angular spread of a ribbon ion beam extracted from an ion source, such as an indirectly heated cathode (IHC) ion source.

BACKGROUND

Semiconductor devices are fabricated using a plurality of processes, some of which implant ions into the workpiece. Various ion sources may be used to create the ions. One such mechanism is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the end of the chamber opposite the cathode.

In certain embodiments, the IHC ion source is configured to extract a ribbon ion beam, where a width of the ribbon ion beam is much larger than the height of the ribbon ion beam. Unfortunately, in many systems, the angular spread of the extracted ribbon ion beam is not uniform along its width. For example, the range of beam angles near the center of the ribbon ion beam may be smaller than the range of beam angles near the edges of the ribbon ion beam. In some embodiments, additional components in the beam line, such as quadrupole lenses, may be utilized to try to compensate for this non-uniformity. These remedies may add additional complexity and cost to the beam line system.

Therefore, it would be beneficial if there was a system that could control the uniformity of the vertical angular spread of a ribbon ion beam being extracted from an ion source.

SUMMARY

An ion source capable of extracting a ribbon ion beam with improved vertical angular uniformity is disclosed. The extraction plate and extraction optics are designed such that there is at least one non-uniform gap between adjacent components. A non-uniform gap may be effective in reducing angular spread non-uniformity of the extracted ribbon ion beam. Specifically, for a given gap in the Z direction, ions extracted from regions with lower plasma density may have more vertical angular spread. A larger gap in the Z direction between components in this region may make the vertical angular spread closer to the vertical angular spread of ions extracted from regions with higher plasma density. The non-uniform gap may be created by having an extraction plate that is flat or curved and electrodes that are flat, convex or concave. In certain embodiments, the non-uniform gap is located between the extraction plate and the suppression electrode.

According to one embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; a plasma generator to generate a plasma within the chamber; and a suppression electrode disposed outside the chamber and proximate the extraction aperture, wherein a gap between an exterior surface of the extraction plate and a surface of the suppression electrode facing toward the extraction plate is non-uniform in a width direction, and wherein a difference in the gap is at least 0.3 mm. In some embodiments, a plasma is generated within the chamber and a plasma density within the chamber is non-uniform and wherein a first region in the chamber has a greater plasma density than a second region, and wherein the gap between the exterior surface of the extraction plate and the surface of the suppression electrode facing toward the extraction plate is smaller near the first region than the gap near the second region. In some embodiments, the plasma density is greater at a center of the extraction aperture than at an edge of the extraction aperture. In certain embodiments, the exterior surface of the extraction plate is flat and the surface of the suppression electrode facing toward the extraction plate is convex. In certain embodiments, the exterior surface of the extraction plate is convex and the surface of the suppression electrode facing toward the extraction plate is flat. In certain embodiments, the exterior surface of the extraction plate is convex and the surface of the suppression electrode facing toward the extraction plate is convex. In some embodiments, the plasma density is greater at an edge of the extraction aperture than at a center of the extraction aperture. In certain embodiments, the exterior surface of the extraction plate is flat and the surface of the suppression electrode facing toward the extraction plate is concave. In certain embodiments, the exterior surface of the extraction plate is concave and the surface of the suppression electrode facing toward the extraction plate is flat or concave. In some embodiments, the plasma generator comprises an indirectly heated cathode. In some embodiments, a plasma is generated within the chamber and a plasma density within the chamber is non-uniform and wherein the gap between the exterior surface of the extraction plate and the surface of the suppression electrode facing toward the extraction plate is smallest where the plasma density is greatest. In certain embodiments, the ion source comprises at least one additional electrode positioned such that the suppression electrode is disposed between the at least one additional electrode and the extraction plate, and wherein a second non-uniform gap is located between a set of adjacent electrodes.

According to another embodiment, an ion implantation system is disclosed. The ion implantation system comprises the ion source described above, a mass analyzer; and a platen.

According to another embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; a plasma generator to generate a plasma within the chamber; a suppression electrode disposed outside the chamber and proximate the extraction aperture; and at least one additional electrode positioned such that the suppression electrode is disposed between the at least one additional electrode and the extraction plate, wherein a non-uniform gap in a width direction is disposed between a set of adjacent electrodes. In some embodiments, the at least one additional electrode comprises a ground electrode and the non-uniform gap is disposed between the suppression electrode and the ground electrode. In certain embodiments, a surface of the suppression electrode facing the ground electrode is convex and a surface of the ground electrode facing the suppression electrode is flat or convex. In certain embodiments, a surface of the suppression electrode facing the ground electrode is flat and a surface of the ground electrode facing the suppression electrode is convex. In some embodiments, the at least one additional electrode comprises a second electrode and a third electrode and the non-uniform gap is disposed between the suppression electrode and the second electrode or between the second electrode and the third electrode. In some embodiments, the at least one additional electrode comprises a second electrode, a third electrode and a fourth electrode, and the non-uniform gap is disposed between the suppression electrode and the second electrode, between the second electrode and the third electrode, or between the third electrode and the fourth electrode.

According to another embodiment, an ion source is disclosed. The ion source comprises a chamber comprising a first end, a second end and a plurality of walls connecting the first end and the second end, wherein one of the plurality of walls is an extraction plate having an extraction aperture; wherein a direction between the first end and the second end is a X direction and a direction perpendicular to the X direction is a Y direction and wherein the extraction aperture has a dimension in the X direction greater than a dimension in the Y direction; a plasma generator to generate a plasma within the chamber; and a suppression electrode disposed outside the chamber and proximate the extraction aperture, wherein a gap between an exterior surface of the extraction plate and a surface of the suppression electrode facing toward the extraction plate is non-uniform in the X direction, and wherein a difference in the gap is at least 0.3 mm.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
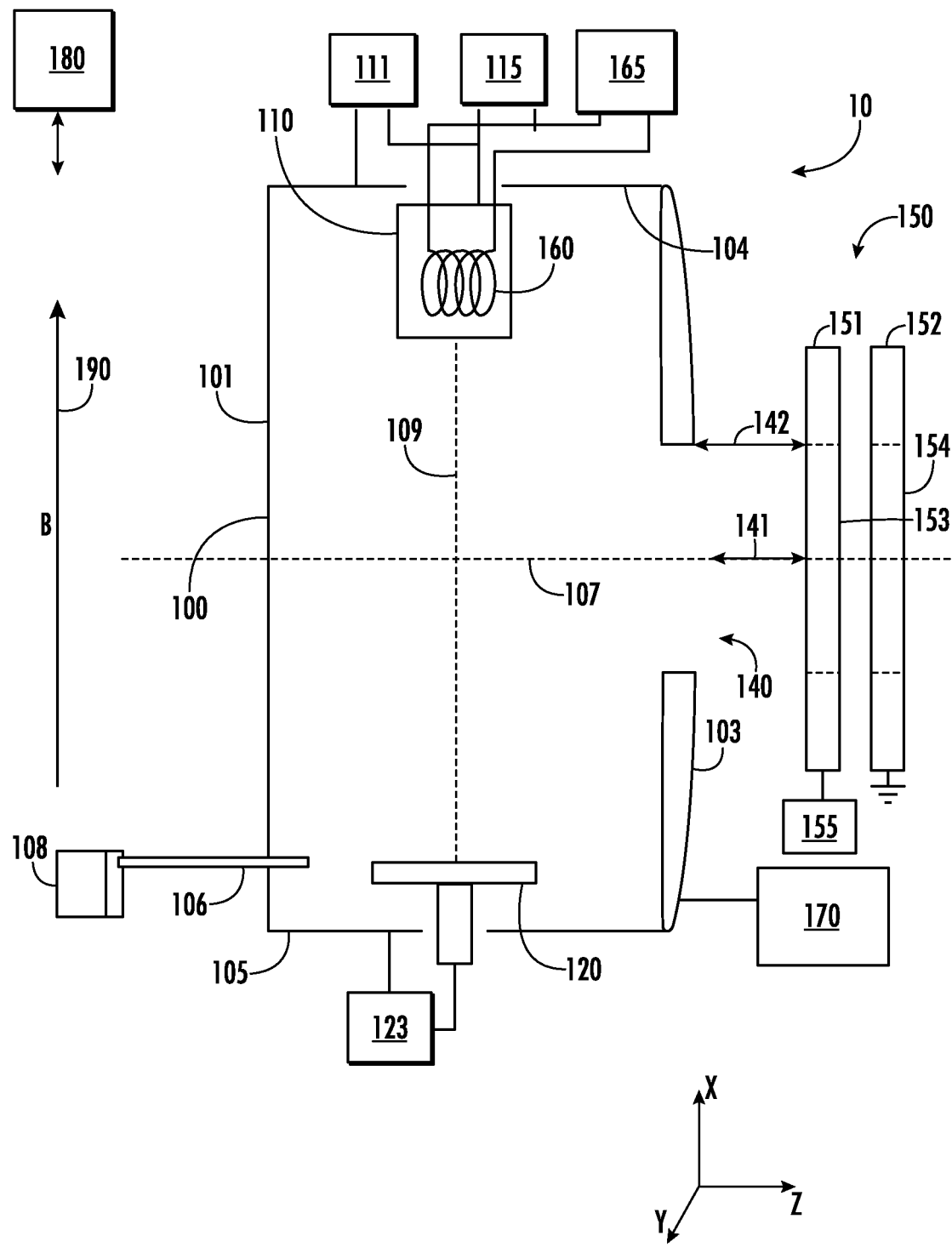
FIG. 1 is a block diagram showing an IHC ion source and extraction optics according to one embodiment.

FIG. 1 shows an IHC ion source 10 with extraction optics 150 that may be utilized to extract a ribbon ion beam with improved vertical angular uniformity according to one embodiment. In this embodiment, the IHC ion source 10 includes a chamber 100, comprising two opposite ends, and walls 101 connecting to these ends. These walls 101 include side walls, an extraction plate 103 and a bottom wall opposite the extraction plate 103. The extraction plate 103 includes an extraction aperture 140 through which ions are extracted. The extraction aperture 140 may be much larger in the width direction, also referred to as the X direction, than in the height direction, also referred to as the Y direction. The X direction may be defined as the direction between the first end 104 and the second end 105. The Y direction is perpendicular to the X direction. The Z direction is defined along the thickness of the extraction plate 103 and is defined as the direction of travel for the ribbon ion beam. For example, the extraction aperture 140 may be greater than 2 inches in the width direction and less than 0.5 in the height direction. Further, the extraction aperture may be any shape. In some embodiments, the extraction aperture 140 may be oval or rectangular. In other embodiments, the extraction aperture 140 may have an irregular shape. In all embodiments, the longer dimension is referred to as the width and the shorter dimension is referred to as the height.

The walls 101 of the chamber 100 may be constructed of an electrically conductive material, such as tungsten or another refractory metal, and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into chamber 100 to ionize the neutral gas. The current drawn by this arc voltage power supply 111 is a measurement of the amount of current being driven through the plasma. In certain embodiments, the walls 101 provide the ground reference for the other power supplies.

In this embodiment, a repeller 120 is disposed in the chamber 100 on the second end 105 of the chamber 100 opposite the cathode 110. The center of the cathode 110 and the center of the repeller 120 may form two points on the central axis 109 of the chamber 100.

The repeller 120 may be in electrical communication with a repeller power supply 123. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 123 or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e., the x direction). Thus, electrons do not experience electromagnetic force to move in the x direction. However, movement of the electrons in other directions may experience an electromagnetic force.

One or more gas containers 108 may be in communication with the chamber 100 via a gas inlet 106. Each gas container 108 may include a mass flow controller (MFC) so as to regulate a flow of gas from each gas container.

An extraction power supply 170 may be used to bias the walls 101 of the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

The extraction optics 150 are used to attract ions from within the chamber using electric fields. In certain embodiments, the extraction optics 150 comprises a suppression electrode 151, which is negatively biased relative to the plasma so as to attract ions through the extraction aperture 140.

The suppression electrode 151 may be a single electrically conductive component with a suppression aperture 153 disposed therein. Alternatively, the suppression electrode 151 may be comprised of two electrically conductive components that are spaced apart so as to create the suppression aperture 153 between the two components. The suppression electrode 151 may be a metal, such as titanium. The suppression electrode 151 may be electrically biased using a suppression power supply 155. The suppression electrode 151 may be biased so as to be more negative than the extraction plate 103. In certain embodiments, the suppression electrode 151 is negatively biased by the suppression power supply 155, such as at a voltage of between −3 kV and −15 kV.

In other embodiments, the extraction optics 150 comprises a suppression electrode 151 and a ground electrode 152, where the suppression electrode 151 is disposed between the extraction plate 103 and the ground electrode 152.

In these embodiments, the ground electrode 152 may be disposed proximate the suppression electrode 151. Like the suppression electrode 151, the ground electrode 152 may be a single electrically conductive component with a ground aperture 154 disposed therein, or may be comprised of two components that are spaced apart so as to create the ground aperture 154 between the two components. The ground electrode 152 may be electrically connected to ground. Of course, in other embodiments, the ground electrode 152 may be biased using a separate power supply. The extraction aperture 140, the suppression aperture 153 and the ground aperture 154 are all aligned.

In other embodiments, the extraction optics 150 may comprise in excess of two electrodes, such as three electrodes or four electrodes. In these embodiments, the electrodes may be functionally and structurally similar to those described above, but may be biased at different voltages.

Each electrode has two surfaces, a first surface facing toward the IHC ion source 10, which may be referred to as the proximal surface, or source side surface, and a second surface facing toward the platen 260, referred to as the distal surface, or beamline side surface.

A controller 180 may be in communication with one or more of the power supplies such that the voltage or current supplied by these power supplies may be monitored and/or modified. Additionally, the controller 180 may be in communication with the MFCs of each gas container 108 so as to regulate a flow of each gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 2:
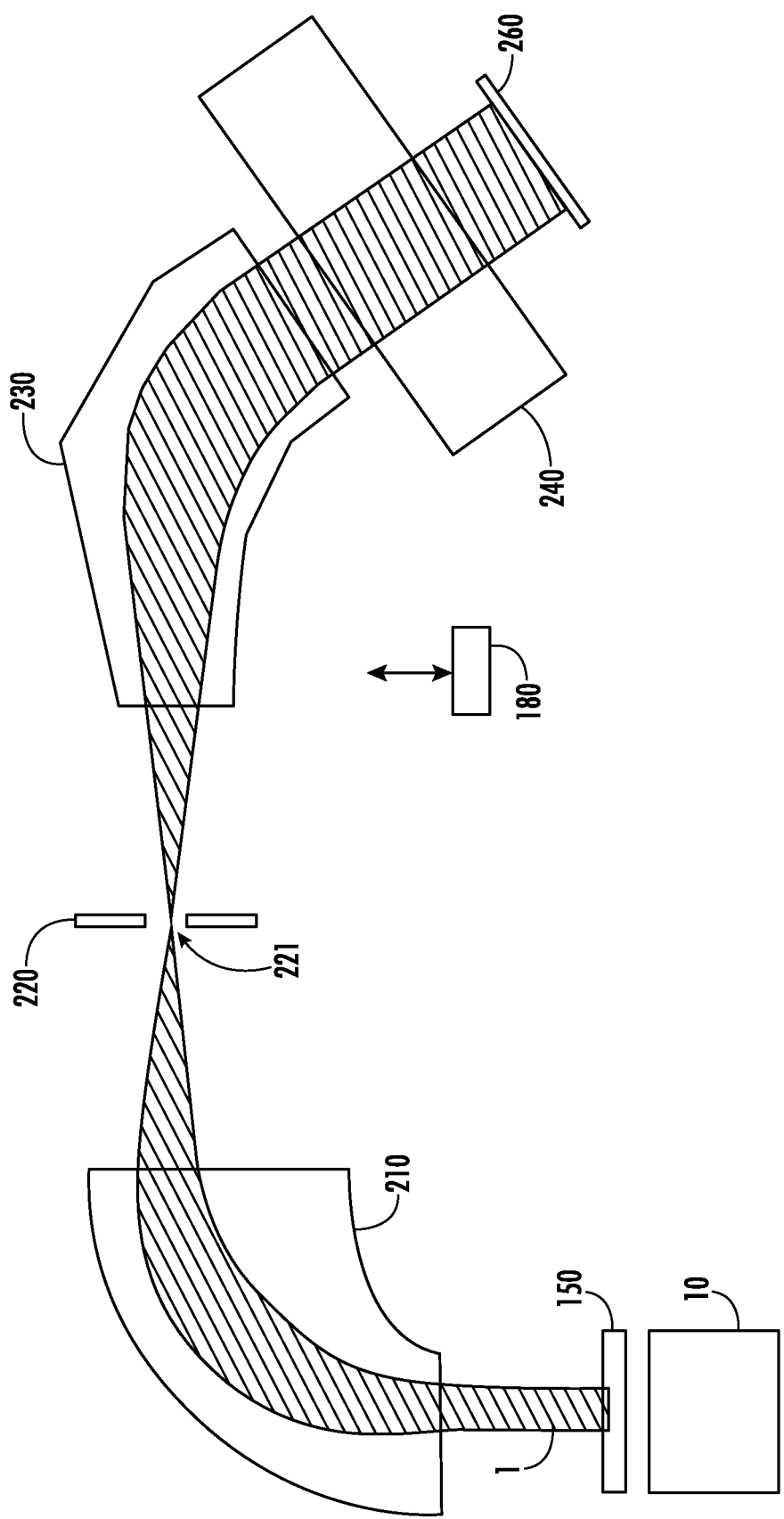
FIG. 2 is a block of an ion implantation system that uses the IHC ion source of FIG. 1.

FIG. 2 shows an ion implantation system using the IHC ion source 10 of FIG. 1. Disposed outside and proximate the extraction aperture of the IHC ion source 10 is the extraction optics 150, which may comprise one or more electrodes.

Located downstream from the extraction optics 150 is a mass analyzer 210. The mass analyzer 210 uses magnetic fields to guide the path of the extracted ribbon ion beam 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the extracted ribbon ion beam 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the extracted ribbon ion beam 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

In FIG. 1, the exterior surface of the extraction plate 103 is convex, such that it protrudes further from the chamber 100 at the center 107 than at the edges. The radius of curvature may be between 500 mm and 1000 mm, as an example. The center 107 of the extraction aperture 140 is defined as the midpoint along the X direction. Further, the suppression electrode 151 may be straight. In this way, the gap, in the Z direction, between the exterior surface of the extraction plate 103 and the source side surface of the suppression electrode 151 is not constant. Specifically, the center gap 141, located at the center 107, is smaller than the edge gap 142 at the edge of the extraction aperture 140. In certain embodiments, the difference between center gap 141 and edge gap 142 may be at least 0.3 mm. In certain embodiments, the center gap 141 may be between 4 and 50 mm, while the edge gap 142 may be between 4.3 and 55 mm. Thus, a non-uniform gap is created, where the gap is in the Z direction and the non-uniformity is in the X, or width direction.

In certain embodiments, it has been found that, for a given gap in the Z direction, ions extracted from a region in the chamber having lower plasma density tend to have a greater vertical angular spread than ions extracted from a region having a greater plasma density. By increasing the distance between the exterior surface of the extraction plate 103 and the source side surface of the suppression electrode 151, this vertical angular spread may be made similar to the vertical angular spread associated with higher plasma density regions. Thus, for an ion source in which the plasma density is greatest near the center 107, the configuration shown in FIG. 1 may reduce vertical angular spread of the extracted ribbon ion beam, especially near the edges of the extraction aperture 140, thus making the vertical angular spread more uniform across the width direction.

Figure 3:
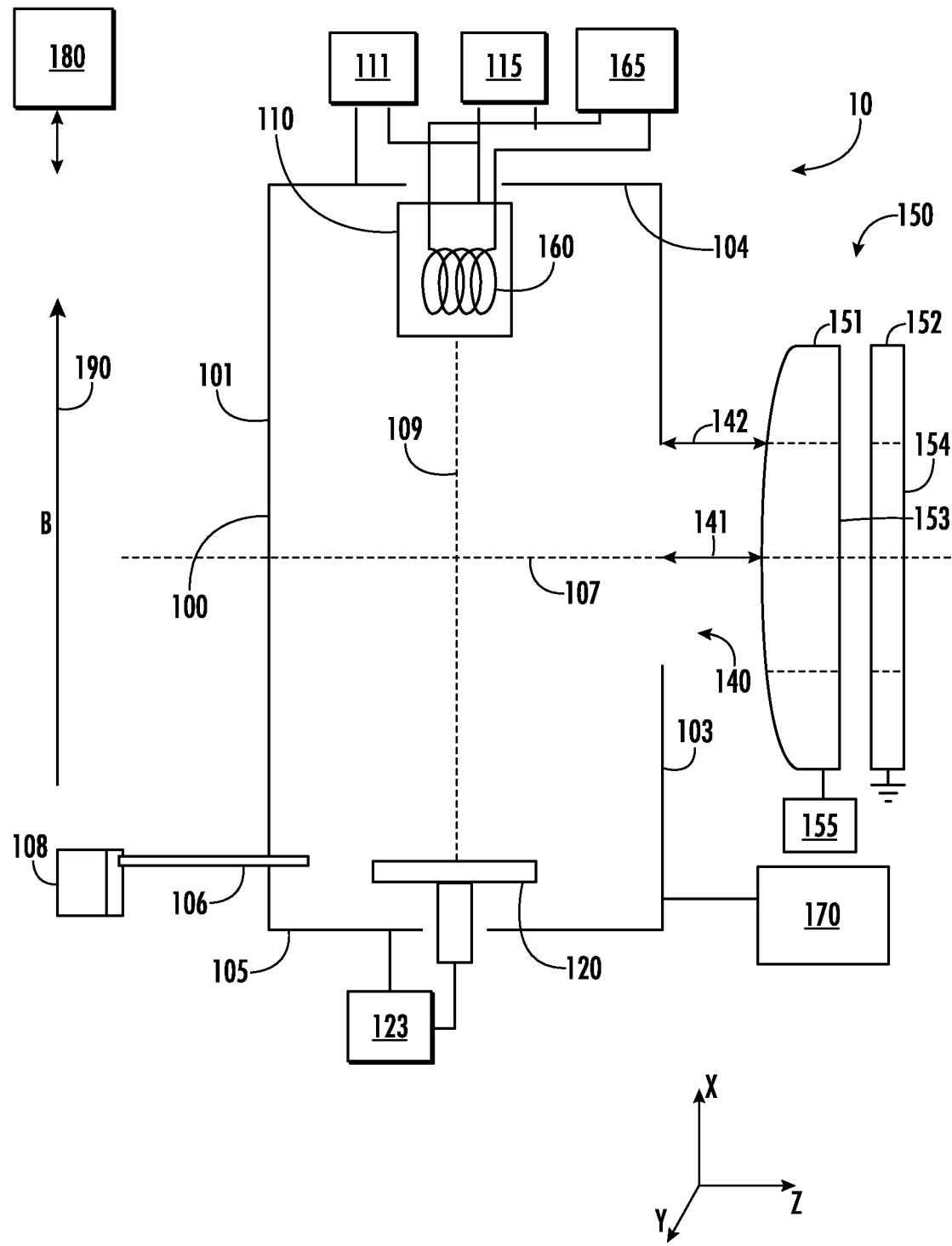
FIG. 3 is a block diagram showing an IHC ion source and extraction optics according to a second embodiment.

FIG. 3 shows a second embodiment that may be used to reduce vertical angular spread when the plasma is densest in the center 107 of the chamber 100. In this embodiment, the exterior surface of the extraction plate 103 is flat or planar, while the surface of the suppression electrode 151 that faces the extraction plate 103 is convex. The radius of curvature of the suppression electrode 151 may be greater than 100 mm, such as between 100 mm and 1000 mm. As with FIG. 1, this configuration allows the center gap 141 to be smaller than the edge gap 142. In some embodiments, edge gap 142 may be at least 0.3 mm larger than the center gap 141.

In certain embodiments, both the exterior surface of the extraction plate 103 and the proximal surface of the suppression electrode 151 may be convex.

Figure 4A:
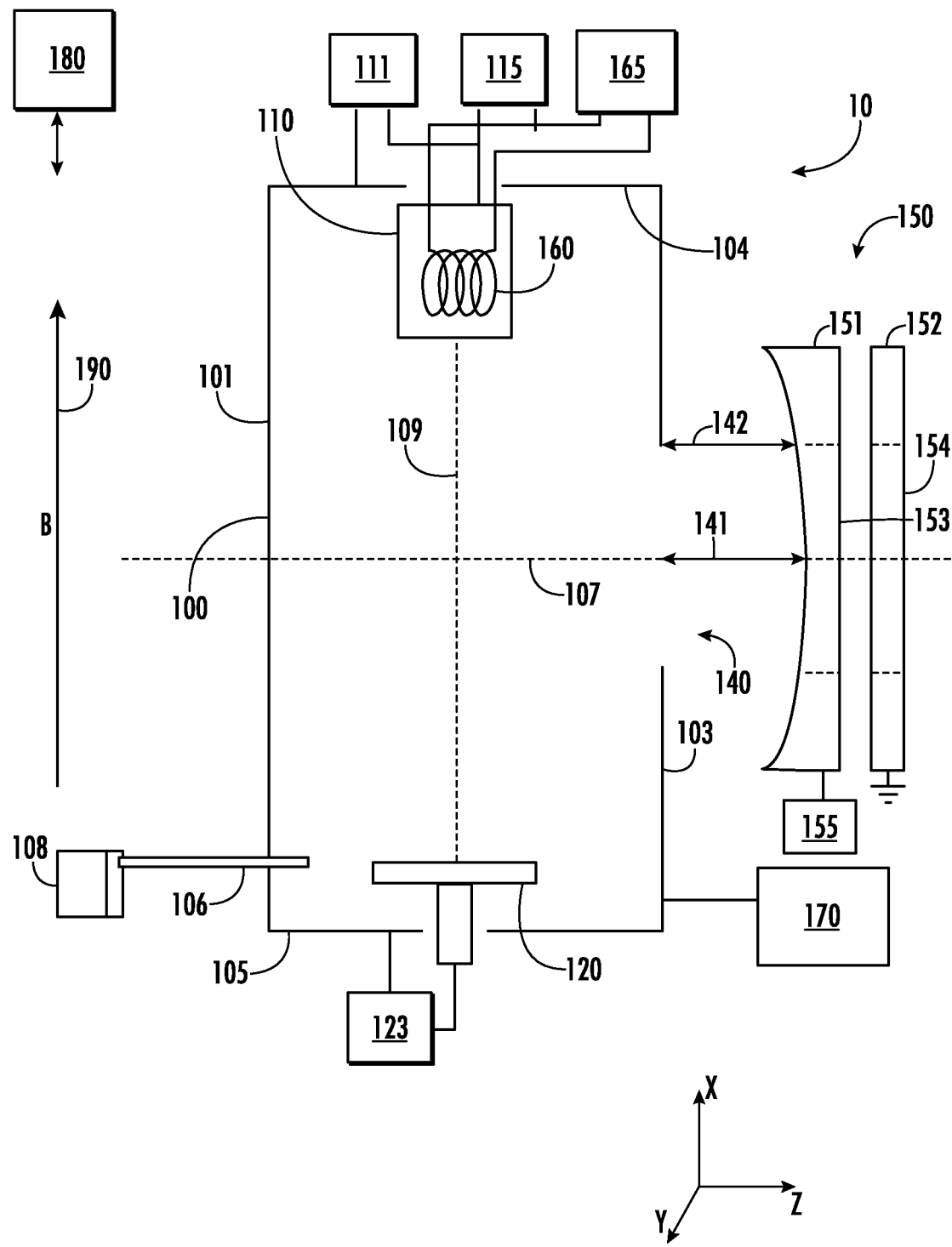
FIG. 4A-4B are block diagrams showing an IHC ion source and extraction optics according to a third and fourth embodiment.

In other embodiments, the plasma density may be less in the center 107 than at the edges. In these embodiments, it may be desirable to have the center gap 141 be greater than the edge gap 142. FIG. 4A shows a configuration that achieves this result. In this embodiment, the proximal surface of the suppression electrode 151 facing the extraction plate 103 is concave. The radius of curvature may be between 400 mm and 1000 mm. The exterior surface of the extraction plate 103 is flat or planar. This allows the center gap 141 to be greater than the edge gap 142. Again, in some embodiments, the difference between the center gap 141 and the edge gap 142 may be more than 0.3 mm.

Figure 4B:
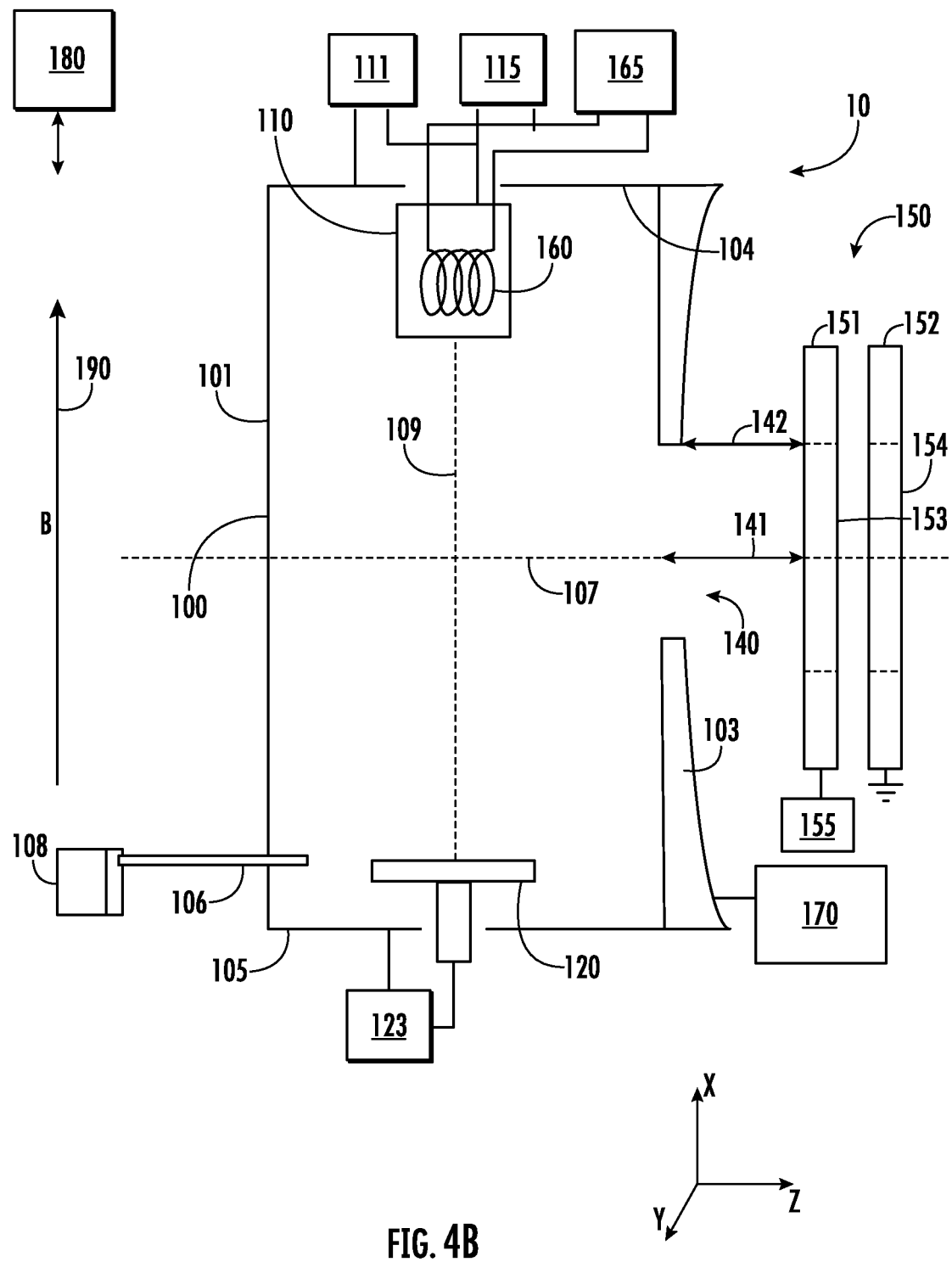

In another embodiment, shown in FIG. 4B, the exterior surface of the extraction plate 103 may be concave, while the proximal surface of the suppression electrode 151 is flat or concave. This configuration also allows the center gap 141 to be greater than the edge gap 142.

While the earlier description discloses a non-uniform gap between the exterior surface of the extraction plate 103 and the proximal surface of the suppression electrode 151, other embodiments are also possible.

In configurations where the extraction optics 150 comprises more than one electrode, there are also gaps between adjacent electrodes. For example, in FIG. 1, there are two electrodes, and thus a gap between the suppression electrode 151 and the ground electrode 152. In extraction optics with N electrodes, where N is greater than 1, there are N−1 gaps between adjacent electrodes.

Thus, in certain embodiments, the non-uniform gap described above may not be between the exterior surface of the extraction plate 103 and the proximal surface of the suppression electrode 151, but rather between two adjacent electrodes in the extraction optics 150.

Figure 5:
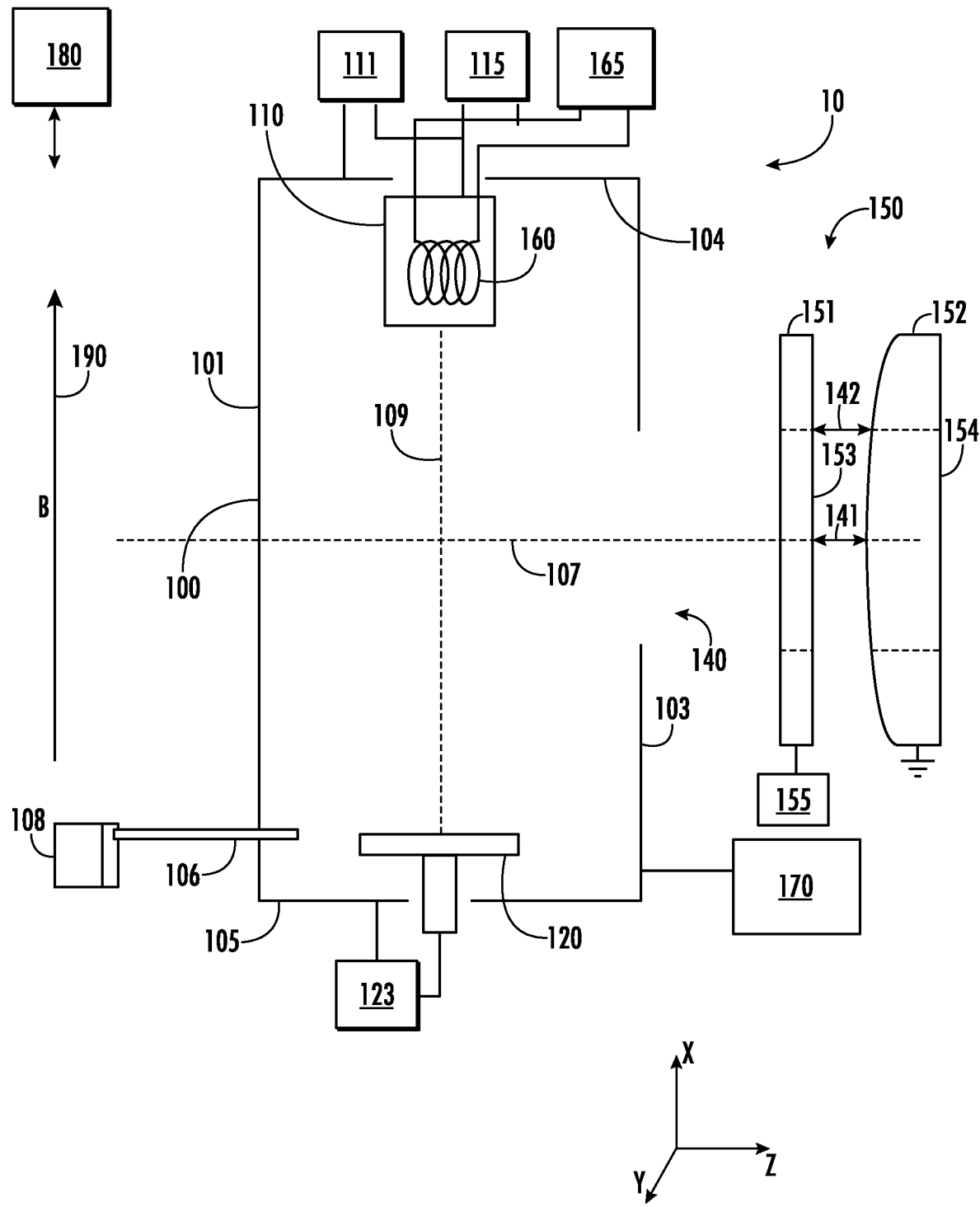
FIG. 5 is a block diagram showing an IHC ion source and extraction optics according to a fifth embodiment.

FIG. 5 shows one such embodiment. In this embodiment, the exterior surface of the extraction plate 103 is flat, as are both surfaces of the suppression electrode 151. The proximal surface of the ground electrode 152, which faces the suppression electrode 151, is convex. Thus, the gap between the suppression electrode 151 and the ground electrode 152 is non-uniform. In this embodiment, the center gap 141 is smaller than the edge gap 142. In certain embodiments, this difference may be at least 0.3 mm.

It is noted that there are other configurations that result in the center gap 141 between electrodes being smaller than the edge gap 142. For example, the distal surface of the suppression electrode 151 may be convex, while the proximal surface of the ground electrode 152 is flat. Alternatively, the distal surface of the suppression electrode 151 and the proximal surface of the ground electrode 152 may both be convex.

Figure 6:
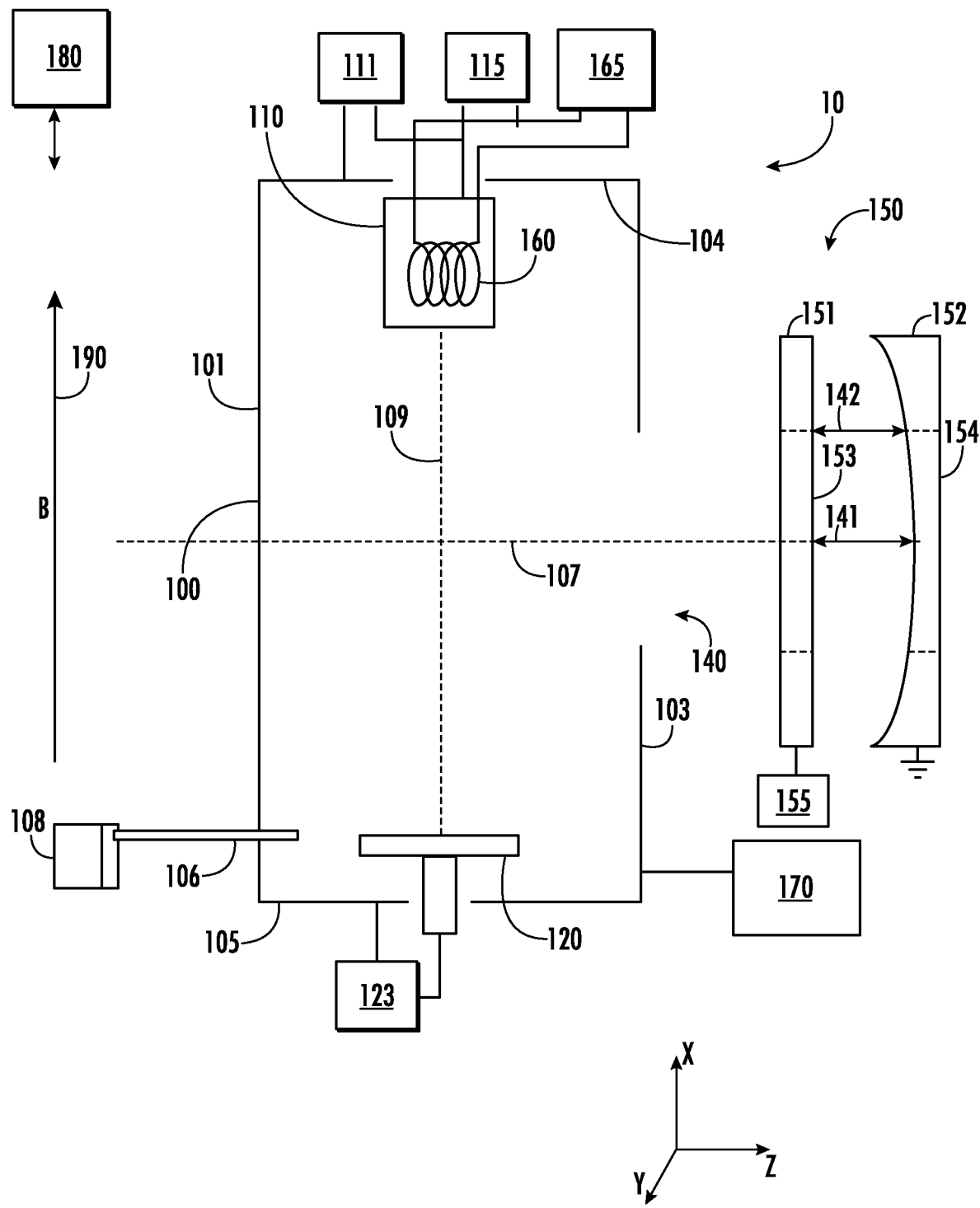
FIG. 6 is a block diagram showing an IHC ion source and extraction optics according to a sixth embodiment.

FIG. 6 shows an embodiment that achieves a larger center gap 141 between two adjacent electrodes. In this embodiment, the distal surface of the suppression electrode 151 is flat, while the proximal surface of the ground electrode 152 is concave. In this way, the center gap 141 is larger than the edge gap 142. In certain embodiments, this difference may be at least 1 cm.

It is noted that there are other configurations that result in the center gap 141 between electrodes being larger than the edge gap 142. For example, the distal surface of the suppression electrode 151 may be concave, while the proximal surface of the ground electrode 152 is flat. Alternatively, the distal surface of the suppression electrode 151 and the proximal surface of the ground electrode 152 may both be concave.

Further, while FIGS. 5-6 show the non-uniform gap being between the suppression electrode 151 and the ground electrode 152, other configurations are possible. For example, in ion sources where the extraction optics have three electrodes, the non-uniform gap may be between the suppression electrode and the second electrode, or between the second and third electrodes. Similarly, in ion sources where the extraction optics have four electrodes, the non-uniform gap may be between the suppression electrode and the second electrode, between the second and third electrodes, or between the third and fourth electrodes.

Figure 7:
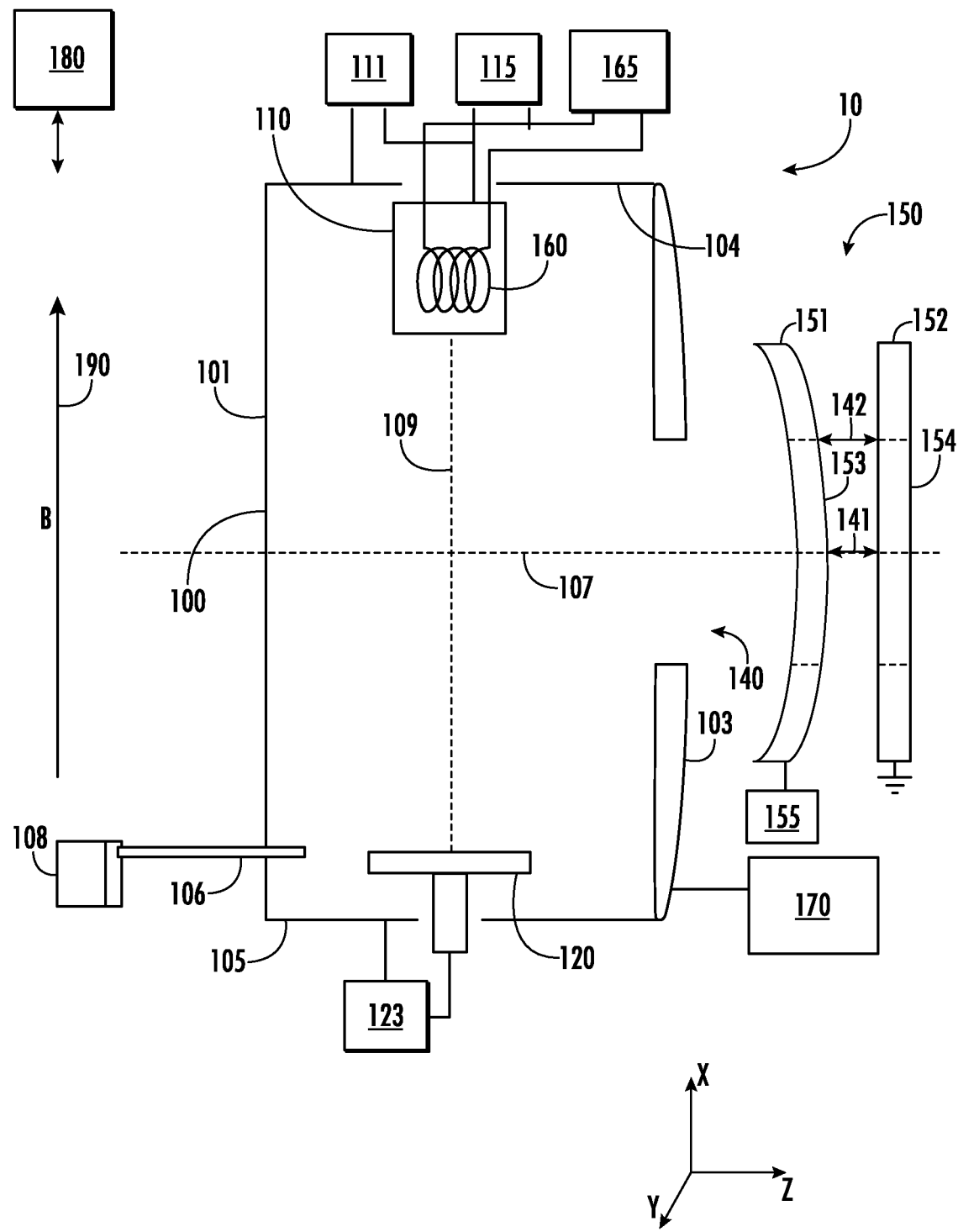
FIG. 7 is a block diagram showing an IHC ion source and extraction optics according to a seventh embodiment.

Additionally, while FIGS. 1 and 3-6 show at least one surface of each electrode being flat, other configurations are also possible. For example, referring to FIG. 7, it is possible that the exterior surface of the extraction plate 103 is convex and the proximal surface of the suppression electrode 151 is concave, such that the gap between the proximal surface of the suppression electrode 151 and the exterior surface of the extraction plate 103 is uniform. In one embodiment, the distal surface of the suppression electrode 151 may be convex while the proximal surface of the ground electrode 152 is flat, such that the gap between the suppression electrode 151 and the ground electrode 152 is non-uniform. In this way, the non-uniform gap shown in FIG. 1 is moved to between the suppression electrode 151 and the ground electrode 152.

Additionally, in certain embodiments, there may be more than one gap that is non-uniform. For example, the extraction plate 103 of FIG. 1 may be combined with the ground electrode of FIG. 5 to create two non-uniform gaps; a first between the exterior surface of the extraction plate 103 and the proximal surface of the suppression electrode 151 and a second non-uniform gap between the distal surface of the suppression electrode 151 and the proximal surface of the ground electrode 152. Of course, other combinations of extraction plate 103, suppression electrode 151 and ground electrode 152 may be used to achieve multiple non-uniform gaps. Further, if more than two electrodes are used, the multiple non-uniform gaps may be between any set of adjacent electrodes.

The above disclosure describes convex and concave components and the figures show that the components are symmetric about the center 107. However, other embodiments are also possible. For example, if the plasma density is non-uniform but asymmetrical in the X direction, the gap may also be designed to be asymmetric in the X or width direction. For example, the plasma density may be a maximum at a location between the cathode 110 and the center 107. In this embodiment, the gap may be designed so that the minimum gap exists in the X direction at the location of greatest plasma density. Therefore, in certain embodiments, the gap is designed to complement the plasma density profile.

The above describes the ion source as being an IHC ion source. However, other ion sources may also be used with this extraction plate 103. For example, magnetized DC plasma sources, tubular cathode source, Bernas ion source and inductively coupled plasma (ICP) ion sources may also use this extraction plate 103 with these extraction optics 150. Thus, the extraction plate may be used with an ion source having a variety of different plasma generators.

The present system and method have many advantages. In one test, a ribbon ion beam was extracted from an IHC ion source where the gap between the exterior surface of the extraction plate 103 and the proximal surface of the suppression electrode 151 was uniform. The vertical angular spread near the center of the aperture was measured to be about 2° and was tightly grouped between −2° and +2°. However, the vertical angular spread near the edges of the extraction aperture was much greater. Specifically, there was a tight grouping between −1° and +1°, but there were also vertical angles that were as large as ±6°. The test was then repeated using an extraction plate 103 and suppression electrode 151 configured to provide a non-uniform gap in the width direction, where the largest gap was along the edges of the extraction aperture 140. In this test, the vertical angular spread near the center of the extraction aperture was unchanged, however the vertical angular spread near the edges was significantly modified. Specifically, the vertical angular spread was nearly uniform through the width of the ribbon ion beam. This may result in better uniformity at the workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
a chamber comprising a first end, a second end and a plurality of walls connecting the first end and the second end, wherein one of the plurality of walls is an extraction plate having an extraction aperture having a width greater than its height;
a plasma generator to generate a plasma within the chamber; and
a suppression electrode disposed outside the chamber and proximate the extraction aperture, wherein a gap between an exterior surface of the extraction plate and a surface of the suppression electrode facing toward the extraction plate is non-uniform in a width direction, and wherein a difference in the gap is at least 0.3 mm.

2. The ion source of claim 1, wherein a plasma is generated within the chamber and a plasma density within the chamber is non-uniform and wherein a first region in the chamber has a greater plasma density than a second region, and wherein the gap between the exterior surface of the extraction plate and the surface of the suppression electrode facing toward the extraction plate is smaller near the first region than the gap near the second region.

3. The ion source of claim 2, wherein the plasma density is greater at a center of the extraction aperture than at an edge of the extraction aperture.

4. The ion source of claim 3, wherein the exterior surface of the extraction plate is flat and the surface of the suppression electrode facing toward the extraction plate is convex.

5. The ion source of claim 3, wherein the exterior surface of the extraction plate is convex and the surface of the suppression electrode facing toward the extraction plate is flat.

6. The ion source of claim 3, wherein the exterior surface of the extraction plate is convex and the surface of the suppression electrode facing toward the extraction plate is convex.

7. The ion source of claim 2, wherein the plasma density is greater at an edge of the extraction aperture than at a center of the extraction aperture.

8. The ion source of claim 7, wherein the exterior surface of the extraction plate is flat and the surface of the suppression electrode facing toward the extraction plate is concave.

9. The ion source of claim 7, wherein the exterior surface of the extraction plate is concave and the surface of the suppression electrode facing toward the extraction plate is flat or concave.

10. The ion source of claim 1, wherein the plasma generator comprises an indirectly heated cathode.

11. The ion source of claim 1, wherein a plasma is generated within the chamber and a plasma density within the chamber is non-uniform and wherein the gap between the exterior surface of the extraction plate and the surface of the suppression electrode facing toward the extraction plate is smallest where the plasma density is greatest.

12. The ion source of claim 1, further comprising at least one additional electrode positioned such that the suppression electrode is disposed between the at least one additional electrode and the extraction plate, and wherein a second non-uniform gap is located between a set of adjacent electrodes.

13. An ion implantation system, comprising:
the ion source of claim 1;
a mass analyzer; and
a platen.

14. An ion source, comprising:
a chamber comprising a first end, a second end and a plurality of walls connecting the first end and the second end, wherein one of the plurality of walls is an extraction plate having an extraction aperture having a width greater than its height;
a plasma generator to generate a plasma within the chamber;
a suppression electrode disposed outside the chamber and proximate the extraction aperture; and
at least one additional electrode positioned such that the suppression electrode is disposed between the at least one additional electrode and the extraction plate, wherein a non-uniform gap in a width direction is disposed between a set of adjacent electrodes, wherein the set of adjacent electrodes are disposed downstream from the extraction plate and the non-uniform gap is disposed in a region defined between edges of the extraction aperture in the width direction.

15. The ion source of claim 14, wherein the at least one additional electrode comprises a ground electrode and the non-uniform gap is disposed between the suppression electrode and the ground electrode.

16. The ion source of claim 15, wherein a surface of the suppression electrode facing the ground electrode is convex and a surface of the ground electrode facing the suppression electrode is flat or convex.

17. The ion source of claim 15, wherein a surface of the suppression electrode facing the ground electrode is flat and a surface of the ground electrode facing the suppression electrode is convex.

18. The ion source of claim 14, wherein the at least one additional electrode comprises a second electrode and a third electrode and the non-uniform gap is disposed between the suppression electrode and the second electrode or between the second electrode and the third electrode.

19. The ion source of claim 14, wherein the at least one additional electrode comprises a second electrode, a third electrode and a fourth electrode, and the non-uniform gap is disposed between the suppression electrode and the second electrode, between the second electrode and the third electrode, or between the third electrode and the fourth electrode.

20. An ion source, comprising:
a chamber comprising a first end, a second end and a plurality of walls connecting the first end and the second end, wherein one of the plurality of walls is an extraction plate having an extraction aperture; wherein a direction between the first end and the second end is a X direction and a direction perpendicular to the X direction is a Y direction and wherein the extraction aperture has a dimension in the X direction greater than a dimension in the Y direction;
a plasma generator to generate a plasma within the chamber; and
a suppression electrode disposed outside the chamber and proximate the extraction aperture, wherein a gap between an exterior surface of the extraction plate and a surface of the suppression electrode facing toward the extraction plate is non-uniform in the X direction, and wherein a difference in the gap is at least 0.3 mm.

* * * * *